(12) United States Patent
Kwak et al.

(10) Patent No.: US 6,631,090 B1
(45) Date of Patent: Oct. 7, 2003

(54) CIRCUIT AND METHOD FOR DATA OUTPUT IN SYNCHRONOUS SEMICONDUCTOR DEVICE

(75) Inventors: Jin-Seok Kwak, Suwon (KR); Seong-Jin Jang, Sungnam (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 10/266,789

(22) Filed: Oct. 8, 2002

(30) Foreign Application Priority Data

Apr. 6, 2002 (KR) ........................................ 2002-18806

(51) Int. Cl.$^7$ .............................................. G11C 16/04
(52) U.S. Cl. .............................. 365/189.05; 365/230.08
(58) Field of Search ........................... 365/189.05, 233, 365/230.04, 230.08, 189.12

(56) References Cited

U.S. PATENT DOCUMENTS

| | | | | |
|---|---|---|---|---|
| 5,708,614 A | * | 1/1998 | Koshikawa | 365/201 |
| 6,078,528 A | * | 6/2000 | Johnson et al. | 365/189.05 |
| 6,147,926 A | | 11/2000 | Park | 365/233 |
| 6,160,754 A | | 12/2000 | Suh | 365/233 |
| 6,201,760 B1 | | 3/2001 | Yun et al. | 365/233 |

* cited by examiner

*Primary Examiner*—Anh Phung
(74) *Attorney, Agent, or Firm*—Mills & Onello LLP

(57) ABSTRACT

A data output circuit and method in a synchronous semiconductor device are described. The semiconductor device is preferably a wave pipelined synchronous semiconductor device. A first-stage or former-stage latch unit receives a first bit of a group of data bits to be output. A second-stage or latter-stage latch unit receives a second bit of the group of data bits. A buffering unit is interposed between the first and second stage latch units. The buffering unit receives the second bit from the second-stage latch unit and forwards the second bit to the first-stage latch unit.

37 Claims, 6 Drawing Sheets

CIRCUIT AND METHOD FOR DATA OUTPUT IN SYNCHRONOUS SEMICONDUCTOR DEVICE

RELATED APPLICATION

This application relies for priority on Korean Application No. 2002-18806, filed Apr. 6, 2002, the contents of which are incorporated herein in their entirety by reference.

FIELD OF THE INVENTION

The present invention relates in general to semiconductor devices and, in particular, to data output circuits and methods in high-speed synchronous semiconductor devices.

BACKGROUND OF THE INVENTION

Recent high-speed graphic memories require a superhigh operation speed of about 500 MHz. Accordingly, in accessing memories, the recent trend has been towards adopting a Column Address Strobe (CAS) latency of 7 and a 4-bit pre-fetch technique instead of the existing 2-bit pre-fetch technique. CAS latency is defined as the number of clock cycle intervals from a read command or column address to data output. The data output appears in the number of clock cycles equal to the CAS latency after the issue of the read command. For the convenience of explanation, a CAS latency of n (n is a natural number greater than or equal to 1) is indicated as CLn.

Double Data Rate (DDR) memories for inputting and outputting two data groups during one clock cycle are widely in use to achieve high-speed data input and output. DDR memories process data on both the rising and falling edges of clock signals. 4-bit pre-fetching in DDR memories represents simultaneous preparation of 4 bits, which means the number of activated column select lines (CSLs) is doubled, and a CSL activation period is 2 clock cycles (tCK), where tCK is used to indicate units of a clock cycle.

In general, in 4-bit pre-fetch memories, a data output pin outputs four data groups during two clock cycles, i.e., 2 tCK. In the 4-bit pre-fetching systems, CSLs are active during two clock cycles, so a read command can be applied every two clock cycles. Thus, the minimum time interval (tCCD) between read commands is 2 tCK.

High-speed memories usually adopt a wave-pipeline system to achieve long CAS latency of about CL7. Typically, sixteen latches per data output pin are required to enable a CL7 system to operate properly even at a low frequency and to accomplish a 4-bit pre-fetching system. The number of latches for each data output pin per bit is calculated by dividing the maximum CAS latency by the minimum time interval between read commands (tCCD), i.e., from the formula 'maximum CAS latency/tCCD'. If the maximum CAS latency is CL7 and tCCD is 2 tCK, 3.5 (CL7/2) latches are required. Since half a latch cannot be formed, four latches are required per bit. In 4-bit pre-fetching memories, each data output pin outputs four-bit data in response to a single read command, thus requiring a total of 16 latches per data output pin.

FIG. 1 is a circuit diagram of a conventional data output circuit 100 used in semiconductor devices. The data output circuit 100 uses the wave-pipeline system for realizing CAS latency of 7 (CL7), tCCD of 2 tCK and the 4-bit pre-fetching technique. The conventional data output circuit 100 includes a total of 16 latches 111 through 118 and 121 through 128. FIG. 1 shows bit line sense amplifiers B/L S/A, data sense amplifiers Data S/A and a burst data ordering unit 200, connected to the data output circuit 100. The data stored in a memory cell is carried on a bit line (not shown) when a word line (not shown) is active. The data is sensed and amplified by a bit line sense amplifier (B/L S/A). Data on an activated column select line CSLj (where j is a natural number from 1 to 4) among the data sensed by a bit line sense amplifier B/L S/A is transmitted to a data sense amplifier (Data S/A) and is amplified by the data sense amplifier (Data S/A). Since the data output circuit 100 adopts the 4-bit pre-fetching system, four CSLs are activated at the same time in response to a single read command. The data of the bit line sense amplifiers (B/L S/A) corresponding to the four activated column select lines CSL1, CSL2, CSL3 and CSL4 are amplified by data sense amplifiers (Data S/A) and ordered properly by the burst data ordering unit 200 and simultaneously output to respective four latches out of the latches 111 through 118 and 121 through 128 in the data output circuit 100.

The conventional data output circuit 100 of FIG. 1 adopts a 2-stage multiplexing scheme to multiplex the data output from the latches 111 to 118 and 121 through 128. That is, in the first stage 130, odd data and even data are multiplexed separately. Thereafter, two groups of data obtained after the multiplexing in the first stage are multiplexed in the second stage 140. Odd data denotes data output in association with the rising edge of a clock signal, and even data denotes data output in association with the falling edge of a clock signal.

According to the above-described 2-stage multiplexing of data, the number of junctions for each of multiplexing nodes DOFi and DOSi is reduced from 16 to 8 in the first stage 130. Compared to multiplexing of the outputs of 16 latches at one stage, the 2-stage data multiplexing as shown in FIG. 1 reduces the load on the multiplexing nodes DOFi and DOSi. However, the load on each of the multiplexing nodes DOFi and DOSi is still large, which results in a limit in bandwidth.

FIG. 2 is a data output timing diagram of the conventional data output circuit 100 of FIG. 1. The operation of the conventional data output circuit 100 will now be described with reference to FIGS. 1 and 2.

Four data bits SDIOF1, SDIOF2, SDIOS1 and SDIOS2 are simultaneously output from the burst data ordering unit 200 and sequentially received by their corresponding bit latches. The first data bit SDIOF1 is sequentially fed into the first to fourth latches 111 to 114 one latch at a time, the second data bit SDIOF2 is sequentially fed into the fifth to eighth latches 115 to 118 one latch at a time, the third data bit SDIOS1 is sequentially fed into the ninth to twelfth latches 121 to 124 one latch at a time, and the fourth data bit SDIOS2 is sequentially fed into the thirteenth to sixteenth latches 125 to 128 one latch at a time.

At this time, input control signals DLj (j is a natural number from 1 to 4) control the input of the first to fourth data bits SDIOF1, SDIOF2, SDIOS1 and SDIOS2 to the latches. Multiplexing control signals CDQFj and CDQSj (j is a natural number in the range of 1 to 8) determine the latch in which data is to be output to the odd multiplexing node DOFi and the even multiplexing node DOSi.

The data of the first to eighth latches 111 to 118 are output to the odd multiplexing node DOFi when their corresponding multiplexing control signals CDQFj are active. The data of the ninth to sixteenth latches 121 to 128 are output to the even multiplexing node DOSi when their corresponding multiplexing control signals CDQSj are active. The data in the odd multiplexing node DOFi and the data in the even multiplexing node DOSi are multiplexed to output data DOUT in response to an odd clock signal CLKDQF and an even clock signal CLKDQS, respectively.

Referring to FIG. 2, as the four multiplexing control signals CDQF1, CDQS1, CDQF2 and CDQS2 are sequentially activated, the data of the first latch 111 is output to the odd multiplexing node DOFi, then the data of the ninth latch 121 is output to the even multiplexing node DOSi, then the data of the fifth latch 115 is output to the odd multiplexing node DOFi, and then the data of the thirteenth latch 125 is output to the even multiplexing node DOSi. The data in the odd multiplexing node DOFi is multiplexed to output data DOUT in response to the odd clock signal CLKDQF, and the data in the even multiplexing node DOSi is multiplexed to output data DOUT in response to the even clock signal CLKDQS. Thus, 4-bit data is continuously output via each data output pin over two cycles of a clock signal CLK.

In the conventional data output circuit 100 as described above, the outputs of 8 latches 111 to 118 for odd data are multiplexed to one node DOFi, and the outputs of 8 latches 121 to 128 for even data are multiplexed to one node DOSi. Accordingly, a heavy load is put on each of the nodes DOFi and DOSi, thereby causing a limit in bandwidth. This large load on each of the nodes DOFi and DOSi lengthens the time during which data appears from latches to the nodes DOFi and DOSi.

Connection of eight junctions to each node degrades the developing speed for detecting data. This degradation of the data developing speed lengthens the period of time tDF from when data appears on the node DOFi shown in FIG. 2 to a rising edge of the clock signal CLKDQF and the period of time tDS from when data appears on the node DOSi shown in FIG. 2 to a rising edge of the clock signal CLKDQS.

Therefore, a large load on multiplexing nodes is a factor in delaying the data access time expressed as tAA, which denotes the period of time from a clock when a read command is applied to when output data appears on an output data pad, that is, the access time from the moment when a read command with a column address is applied to when output data is output on an output data pad.

SUMMARY OF THE INVENTION

To solve the above-described problems, it is an object of the present invention to provide a data output circuit in synchronous semiconductor devices that can improve the frequency characteristics and the data access time (tAA) by reducing the load on the internal nodes in a synchronous semiconductor device.

Another object of the present invention is to provide a data output method for synchronous semiconductor devices that can improve the frequency characteristics and the data access time (tAA) by reducing the load on the output nodes in a synchronous semiconductor device.

In one aspect, the invention is directed to a data output circuit and method in a synchronous semiconductor device for providing a set of data bits as an output. The data output circuit includes a first-stage latch unit for receiving a first bit of the data bits in response to a first control signal, a second-stage latch unit for receiving a second bit of the data bits in response to the first control signal, and a buffering latch unit interposed between the first-stage latch unit and the second-stage latch unit. The buffering latch unit receives the second bit from the second-stage latch unit and forwards the second bit to the first-stage latch unit in response to a second control signal.

In one embodiment, the synchronous semiconductor device is a wave pipelined operating device. The first-stage latch unit can receive the first bit of the data bits and the second-stage latch unit can receive the second bit of the data bits simultaneously. In one embodiment, the first control signal is enabled before the second control signal is enabled, and then the first control signal is disabled in response to the second control signal.

In one embodiment, the first-stage latch unit comprises a plurality of latches for receiving a plurality of the data bits. The second-stage latch unit can also comprise a plurality of latches for receiving a plurality of the data bits.

In one embodiment, the first-stage latch unit is coupled to an output node. The first-stage latch unit forwards the first bit of the data bits to the output node. The data output unit can also include a plurality of switches between the first-stage latch unit and the output node for switching the data bits to the output node.

The data output unit can also include a first plurality of switches between the buffering latch unit and the first-stage latch unit for enabling data to be forwarded from the buffering latch unit to the first-stage latch unit. A second plurality of switches can also be included between the second-stage latch unit and the buffering latch unit to enable data to be forwarded from the second-stage latch unit to the buffering latch unit. The switches can be controlled by the second control signal.

BRIEF DESCRIPTION OF THE DRAWINGS

The foregoing and other objects, features and advantages of the invention will be apparent from the more particular description of a preferred embodiment of the invention, as illustrated in the accompanying drawings in which like reference characters refer to the same parts throughout the different views. The drawings are not necessarily to scale, emphasis instead being placed upon illustrating the principles of the invention.

DETAILED DESCRIPTION OF PREFERRED EMBODIMENTS OF THE INVENTION

In accordance with the invention, in order to solve the frequency limit at output nodes, the present invention adopts a multiplexing approach that first multiplexes only data to be output at the first clock of an output clock signal (hereinafter, referred to as a first clock) with a 2-clock cycle, and then multiplexes the other data to be output at the second clock of the output clock signal (hereinafter, referred to as a second clock). The output clock signal represents a clock signal during which a series of data is output in response to a single read command.

Specifically, data to be output in association with the first clock is fed into former-stage latches. Data to be output in association with the second clock is fed into latter-stage latches, shifted to the former-stage latches through buffering latch means and then multiplexed. Accordingly, the number of latches connected to each multiplexing node decreases, thus reducing a junction load on the multiplexing nodes.

Figure 1:
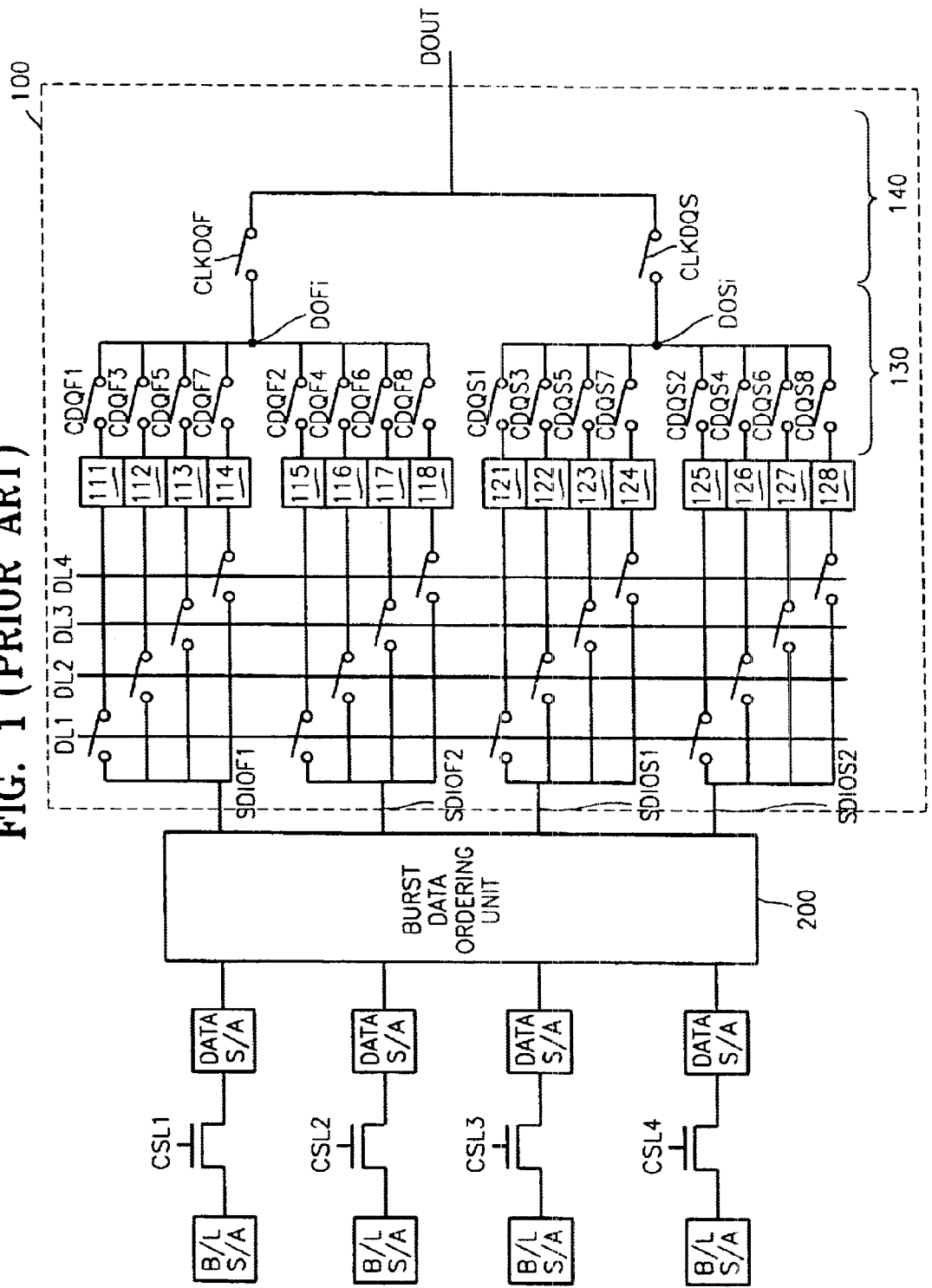
FIG. 1 is a circuit diagram of a conventional data output circuit in a semiconductor device.
Figure 2:
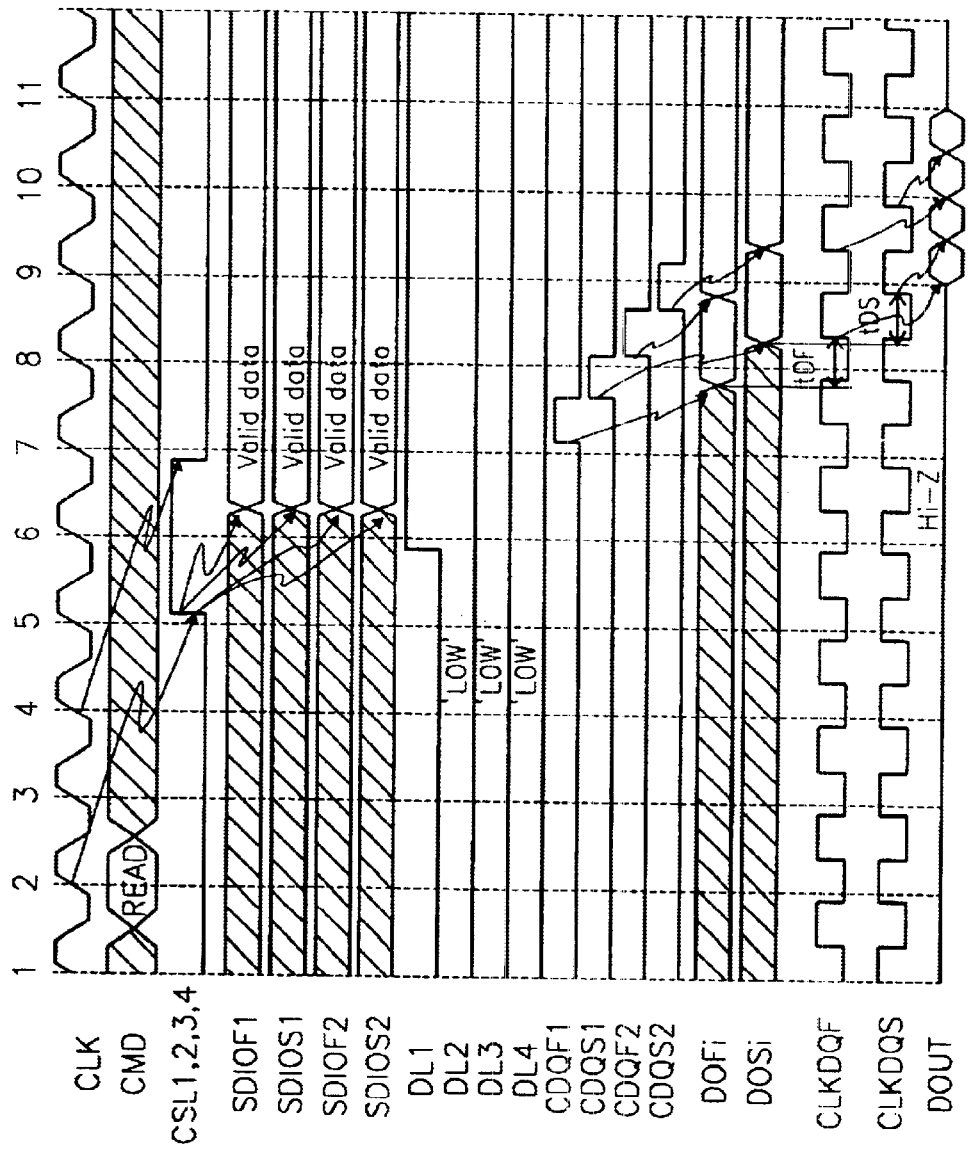
FIG. 2 is a timing diagram illustrating timing of signals is the conventional data output circuit of FIG. 1.
Figure 3A:
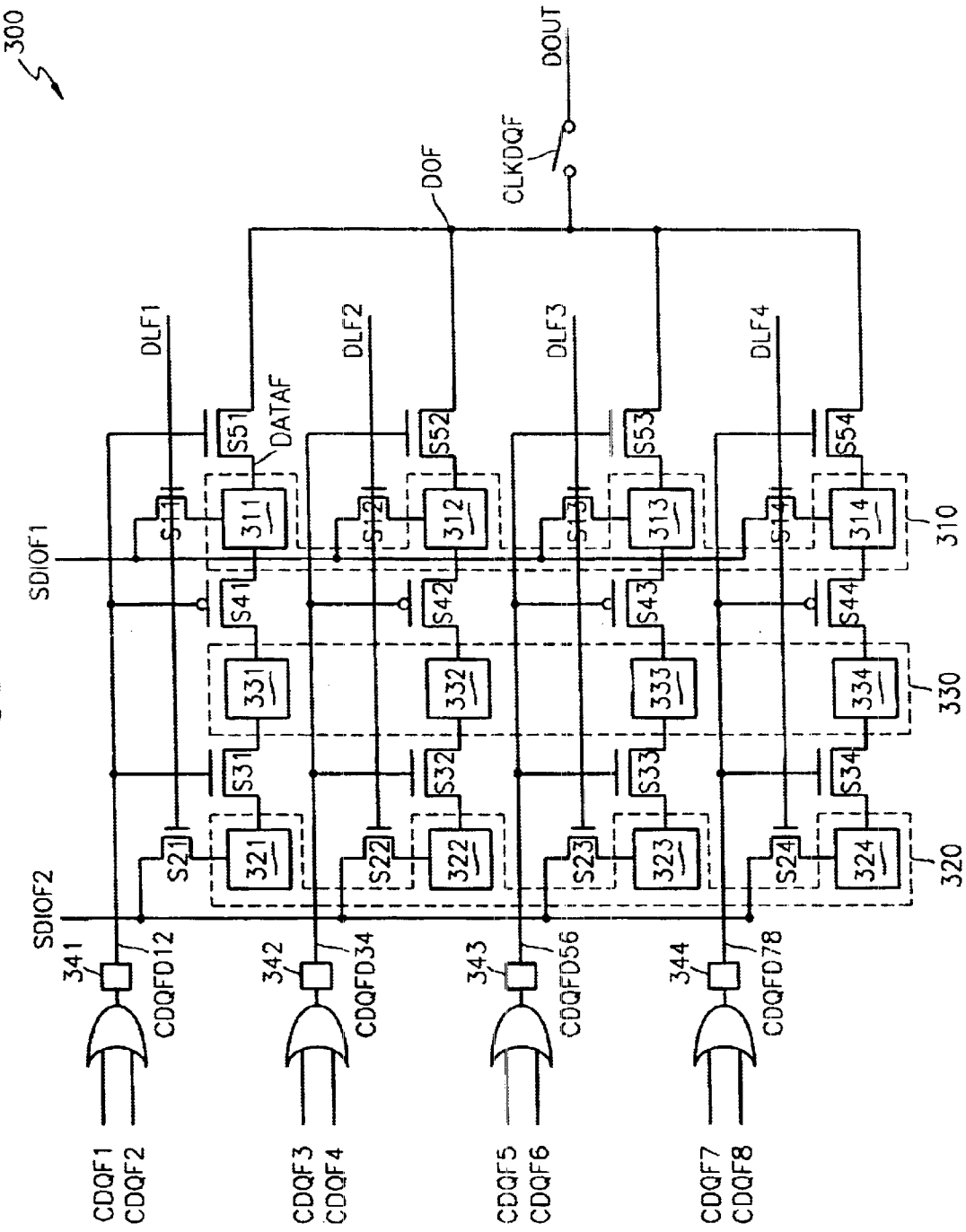
FIGS. 3A and 3B contain block diagrams of two portions of a data output circuit in a synchronous semiconductor device according to an embodiment of the present invention.
Figure 3B:
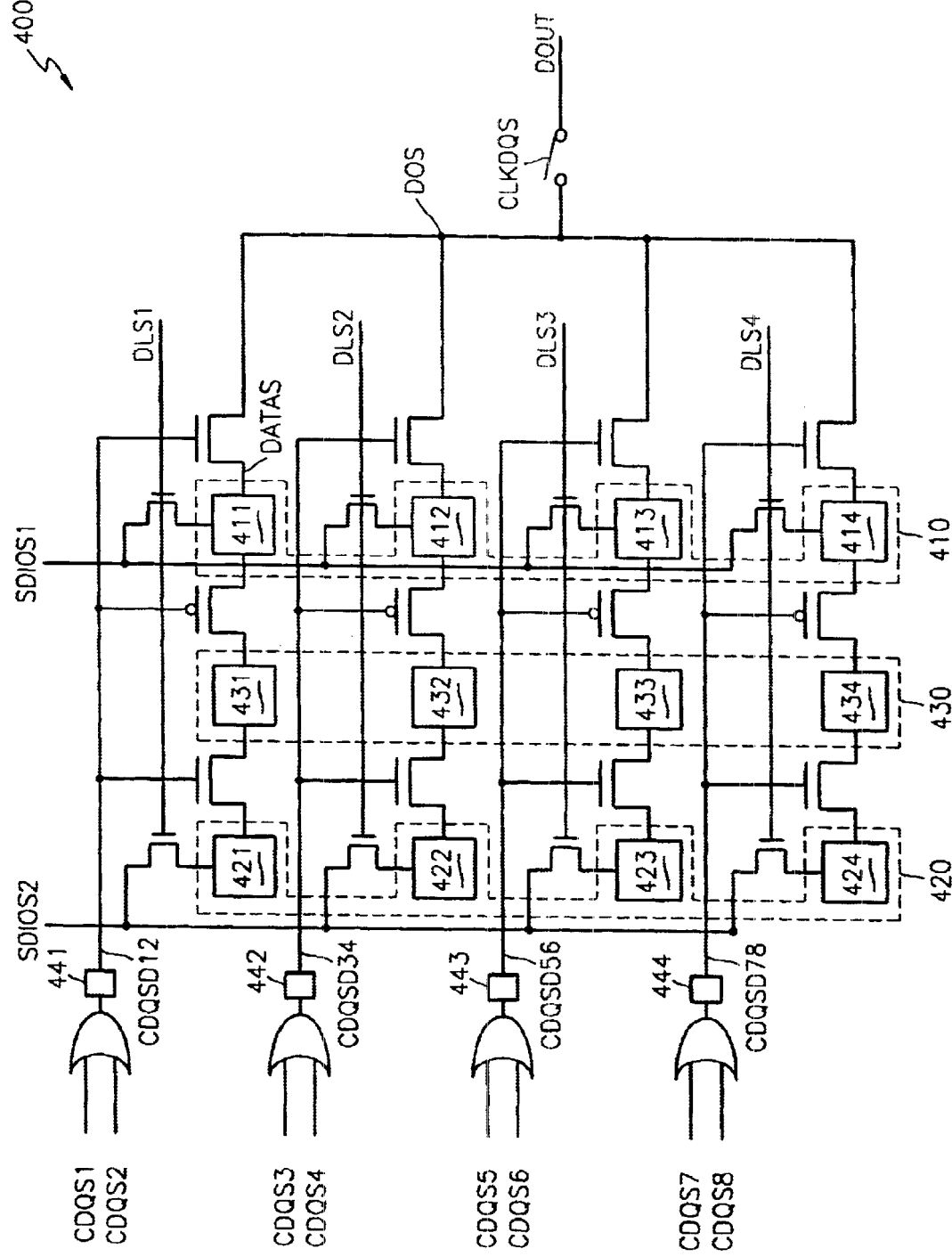

FIGS. 3A and 3B illustrate two portions of a data output circuit in a double data rate (DDR) synchronous semiconductor device according to an embodiment of the present invention. The data output circuit shown in FIGS. 3A and 3B adopts a wave-pipeline system for supporting, for example, a CAS latency of 7 (CL7), tCCD of 2 tCK and 4-bit pre-fetching techniques.

Referring to FIGS. 3A and 3B, the data output circuit according to an embodiment of the present invention includes an odd data output unit 300 and an even data output unit 400. The odd data output unit 300 includes an odd former-stage latch unit 310 for storing first odd data SDIOF1, an odd latter-stage latch unit 320 for storing second odd data SDIOF2, and an odd buffering latch unit 330 for temporarily storing the second odd data SDIOF2. The even data output unit 400 includes an even former-stage latch unit 410 for storing first even data SDIOS1, an even latter-stage latch unit 420 for storing second even data SDIOS2, and an even buffering latch unit 430 for temporarily storing the second even data SDIOS2.

Odd data refers to data outputs in response to the odd phase of a clock signal, and even data refers to data outputs in response to the even phase of a clock signal. The odd phase and even phase of a clock signal correspond to a first portion and a second portion of a cycle of a clock signal, respectively. In this specification, the odd phase means the first edge of a clock signal, and the even phase means the second edge of a clock signal. The first edge denotes the rising edge of a clock signal, and the second edge denotes the falling edge of a clock signal. Data to be output at the first clock of an output clock signal with a 2-clock cycle is referred to as first data, and data to be output at the second clock of the output clock signal is referred to as second data.

Accordingly, the first odd data SDIOF1 is output in response to the odd phase of the first clock signal, the first even data SDIOS1 is output in response to the even phase of the first clock signal, the second odd data SDIOF2 is output in response to the odd phase of the second clock signal, and the second even data SDIOS2 is output in response to the even phase of the second clock signal.

In the output circuit of the invention, the second odd data SDIOF2 is fed into the odd former-stage latch unit 310 via the odd buffering latch unit 330 and then output, and the second even data SDIOS2 is fed into the even former-stage latch unit 410 via the even buffering latch unit 430 and then output.

The configuration of the odd data output unit 300 will now be described in detail referring to FIG. 3A. Each of the odd former-stage latch unit 310 and the odd latter-stage latch unit 320 includes a plurality of latches, the number of which is determined by the number of the maximum CAS latency and tCCD. In this embodiment, as it is assumed that the number of the maximum CAS latency is 7 and tCCD is 2, each of the odd former-stage latch unit 310 and the odd latter-stage latch unit 320 includes 4 latches. For convenience of description, the four latches in the odd, former-stage latch unit 310 are referred to as first to fourth former-stage latches 311 to 314, and the four latches in the odd latter-stage latch unit 320 are referred to as first to fourth latter-stage latches 321 to 324.

The former-stage latches 311 to 314 and the latter-stage latches 321 to 324 have buffering latch means therebetween. That is, the first former-stage latch 311 and the first latter-stage latch 321 have a first buffering latch means 331, the second former-stage latch 312 and the second latter-stage latch 322 have a second buffering latch means 332, the third former-stage latch 313 and the third latter-stage latch 323 have a third buffering latch means 333, and the fourth former-stage latch 314 and the fourth latter-stage latch 324 have a fourth buffering latch means 334.

The operation of the even data output unit 400 of FIG. 3B is similar to that of the odd data output unit 300. Accordingly, to eliminate repetition, description of the operation of the even data output unit 400 will be omitted. The odd data output unit 300 and the even data output unit 400 according to an embodiment of the present invention include a plurality of switches for controlling data input/output to/from each latch and each buffering latch means.

The first odd data SDIOF1 is fed into one of the first to fourth former-stage latches 311 to 314 in response to first to fourth odd input control signals DLFj (where j is a natural number in the range of 1 to 4). The second odd data SDIOF2 is fed into one of the first to fourth latter-stage latches 321 to 324 in response to the first to fourth odd input control signals DLFj. The first to fourth odd input control signals DLFj control switches S11 to S14 for connecting the line for the first odd data SDIOF1 to the first to fourth former-stage latches 311 to 314 and switches S21 to S24 for connecting the line for the second odd data SDIOF2 to the first to fourth latter-stage latches 321 to 324, thereby determining latches into which the first and second odd data SDIOF1 and SDIOF2 are to be fed.

First to eighth odd output control signals CDQFj (where j is a natural number in the range of 1 to 8) control the output of the data received by the latches 311 to 314 and 321 to 324 to an odd multiplexing node DOF. The output control signals fed into controls S31 to S34 and S41 to S44 and S51 to S54 to control the outputs of the latches 311 to 314 and 321 to 324 and the buffering latch means 331 to 334 correspond to first to fourth odd delay signals CDQFD12, CDQFD34, CDQFD56 and CDQFD78, which are obtained by performing OR operations on a pair of first and second odd output control signals CDQF1 and CDQF2, a pair of third and fourth odd output control signals CDQF3 and CDQF4, a pair of fifth and sixth odd output control signals CDQF5 and CDQF6, and a pair of seventh and eighth odd output control signals CDQF7 and CDQF8 and then delaying the OR-performed output control signals.

The output control signals may be delayed by delay units 341 to 344 and 441 to 444. That is, the delay units 341 to 344 and 441 to 444 delay the point in time of activating the output control signals by a predetermined period.

Figure 5:
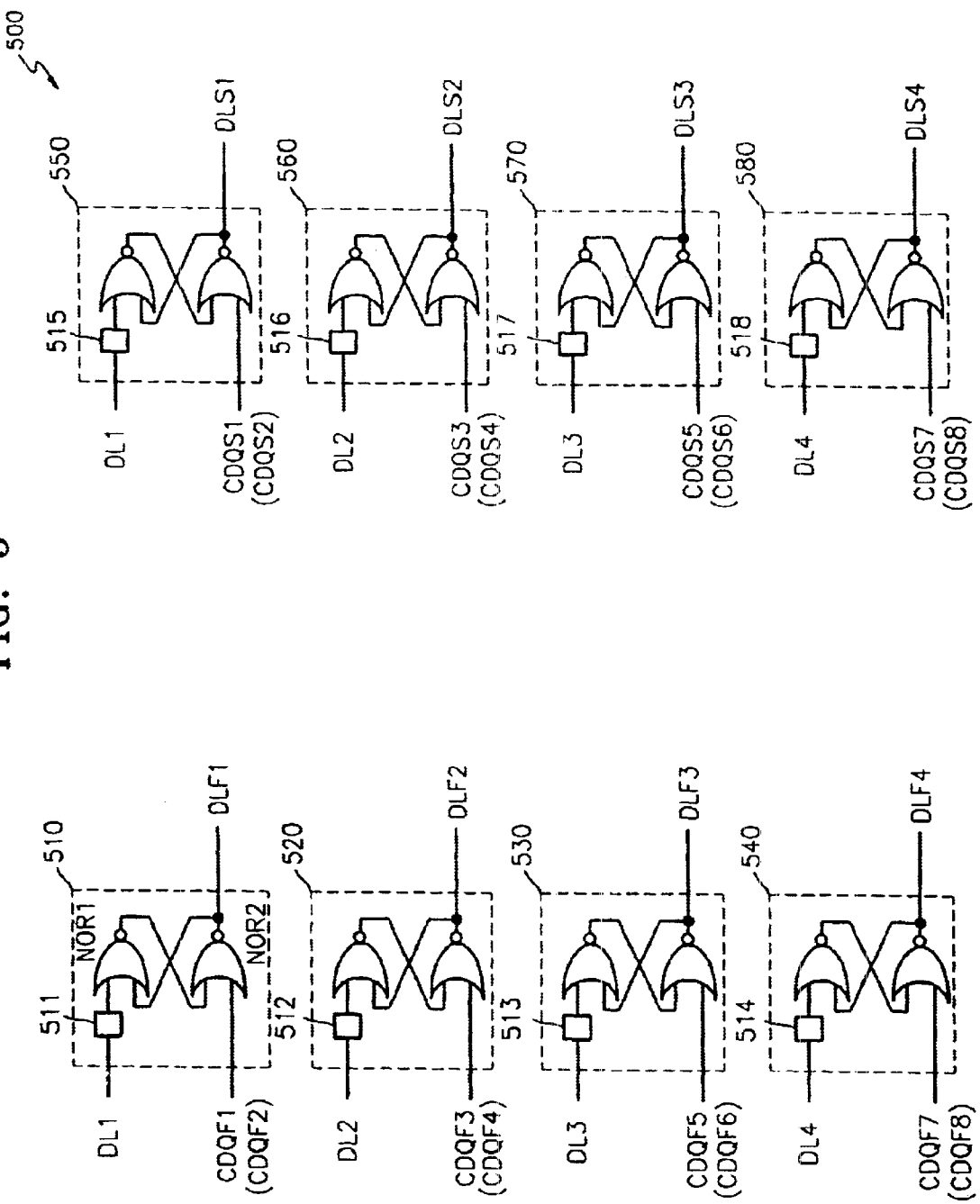
FIG. 5 is a circuit diagram of an embodiment of a circuit for generating the odd input control signals and the even input control signals shown in FIGS. 3A and 3B.

The odd input control signals DLFj are inactivated in response to the activation of the odd output control signals CDQFj. FIG. 5 contains a block diagram illustrating a circuit for generating the odd input control signals DLFj and the even input control signals DLSj (where j is a natural number in the range of 1 to 4).

Since a predetermined delay occurs in the interval from when the odd output control signals CDQFj are activated to when the odd input control signals DLFj are inactivated, data is received by the latches 311 to 314 and 321 to 324 and simultaneously output thereto. This leaves some room for error. In order to prevent the probability of error, it is preferable that the odd delay signals CDQFD12, CDQFD34, CDQFD56 and CDQFD78, which control the output of the data from the latches 311 to 314 and 321 to 324, be activated after being delayed for a predetermined period of time from the point in time when the odd output control signals CDQFj are activated.

In one embodiment, the delay time of each of the delay units 341 to 344 and 441 to 444 is slightly longer than the delay time from when the odd output control signals CDQFj are activated to when the odd input control signals DLFj are inactivated. When the first odd delayed signal CDQFD12 is in a high level, the switch S51 between the first former-stage latch 311 and the odd multiplexing node DOF is turned on to output the data of the first former-stage latch 311 to the odd multiplexing node DOF. At this moment, the switch S31 between the first latter-stage latch 321 and the first buffering latch means 331 is also turned on to apply the data of the first latter-stage latch 321 to the first buffering latch means 331. That is, the first odd data SDIOF1 is output to the odd multiplexing node DOF in response to the first edge (rising edge) of the first odd delayed signal CDQFD12, and the second odd data SDIOF2 is fed into the first buffering latch means 331. When the first odd delayed signal CDQFD12 enters a low level from a high level, the switch S23 between the first buffering latch means 331 and the first former-stage latch 311 is turned on to apply the data of the first buffering latch means 331 to the first former-stage latch 311. That is, the second odd data SDIOF2 is fed into the first former-stage latch 311 in response to the second edge (falling edge) of the first odd delayed signal CDQFD12. In this state, if the first odd delayed signal CDQFD12 goes back to a high level, the switch S51 between the first former-stage latch 311 and the odd multiplexing node DOF is turned on again to output the data fed into the first former-stage latch 311 via the first buffering latch means 331 to the odd multiplexing node DOF. That is, the second odd data SDIOF2 is output to the odd multiplexing node DOF in response to the second rising edge of the first odd delayed signal CDQFD12.

In this manner, the data received by the second to fourth latter-stage latches 322 to 324 are fed into the second to fourth former-stage latches 312 to 314 via the second to fourth buffering latch means 332 to 334, respectively, and then output to the odd multiplexing node DOF.

Due to the above-described configuration in which latches are divided into the odd former-stage latch unit 310 and the odd latter-stage latch unit 320, which have a buffering latch means unit 330 therebetween, the number of junctions on the odd multiplexing node DOF, through which the odd data SDIOF1 and SDIOF2 are output, decreases from eight junctions as in the prior art to four junctions. This leads to a reduction of the load of the odd multiplexing node DOF, such that data can appear in the odd multiplexing node DOF faster than in conventional data output circuits. That is, the data transition in the odd multiplexing node DOF is faster, and the data access time tAA is improved.

The first even data SDIOS1 is fed into one of the fifth to eighth former-stage latches 411 to 414 in response to first to fourth even input control signals DLSj. The second even data SDIOS2 is fed into one of the fifth to eighth latter-stage latches 421 to 424 in response to the first to fourth even input control signals DLSj.

First to eighth even output control signals CDQSj control the output of the data received by the latches 411 to 414 and 421 to 424 to an even multiplexing node DOS. The operation of the even data output unit 400 is similar to that of the odd data output unit 300. Accordingly, to avoid repletion, description of the even data output unit 400 will be omitted.

Odd data output to the odd multiplexing node DOF is output in response to an odd output clock signal CLKDQF to serve as output data DOUT, and even data output to the even multiplexing node DOS is output in response to an even output clock signal CLKDQS to serve as output data DOUT.

Figure 4:
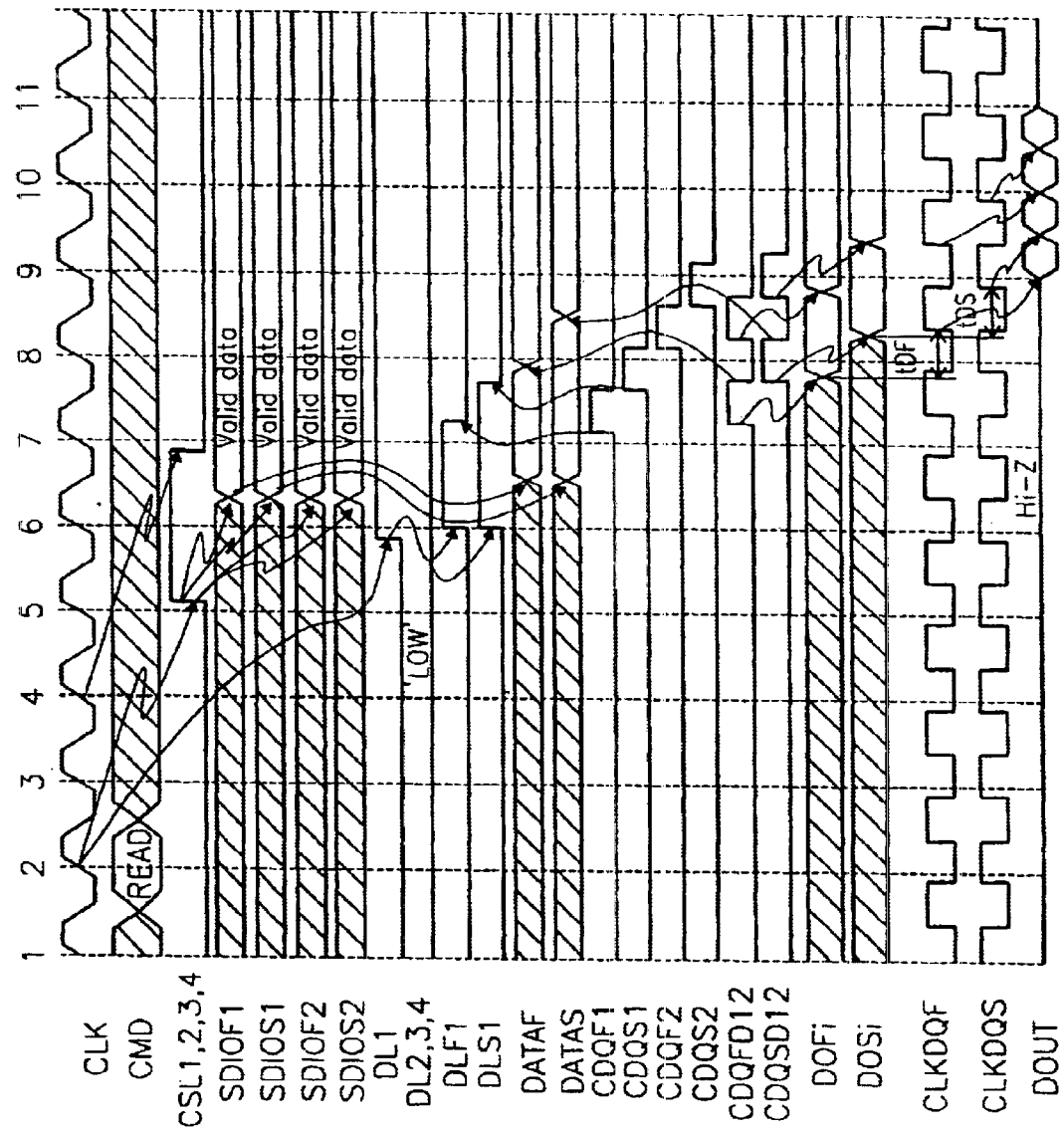
FIG. 4 is a timing diagram illustrating timing of signals of the data output circuit shown in FIGS. 3A and 3B.

FIG. 4 shows an output timing diagram of the data output circuit shown in FIGS. 3A and 3B. The operation of a data output circuit according to an embodiment of the present invention will now be described with reference to FIGS. 3A, 3B and 4.

A read command READ is input at intervals of two cycles of a clock signal CLK. Every time a read command is input, first to-fourth input control signals DL1 to DL4 are sequentially activated to a high level. That is, the first input control signal DL1 is activated to a high level in response to the rising edge of a clock signal CLK where the first read command is input. The second input control signal DL2 is activated to a high level in response to the rising edge of a clock signal CLK where the second read command is input, and, at this time, the first input control signal DL1 is inactivated to a low level.

The first to fourth odd input control signals DLF1 to DLF4 and the first to fourth even input control signals DLS1 to DLS4 are produced from the first to fourth input control signals DL1 to DL4. An embodiment of an input control signal generating unit for producing the first to fourth odd input control signals DLF1 to DLF4 and the first to fourth even input control signals DLS1 to DLS4 is shown in FIG. 5.

When the first odd input control signal DLF1 and the first even input control signal DLS1 are activated to a high level in response to the activation of the first input control signal DL1, the first and second odd data SDIOF1 and SDIOF2 developed by data sense amplifiers are fed into the first former-stage latch 311 and the first latter-stage latch 321, respectively, in rows. For convenience of description, the data of the first former-stage latch 311 in the odd data output unit 300 is referred to as first temporary data DATAF, and the data of the first former-stage latch 411 in the even data output unit 400 is referred to as second temporary data DATAS.

After data is fed into latches, the odd and even output control signals CDQF1 to CDQF8 and CDQS1 to CDQS8 for outputting data are sequentially activated in a similar manner to the activation manner of the input control signals DL1 to DL4.

The first odd input control signal DLF1 is inactivated in response to the activation of the first odd output control signal CDQF1 in order to prevent input and output of data to and from the latches from occurring at the same time. If the first odd output control signal CDQF1 is activated, the first odd delayed signal CDQFD12 is activated after a predetermined delay period.

In response to the activation of the first odd delayed signal CDQFD12, the data DATAF of the first former-stage latch 311 in the odd data output unit 300 is output to the odd multiplexing node DOF, and simultaneously the data of the first latter-stage latch 321 is input to the first buffering latch means 331. When the first odd output control signal CDQF1 is inactivated after half a clock cycle, the first odd delayed signal CDQFD12 is also inactivated, and the data in the first buffering latch means 331 is shifted to the first former-stage latch 311 in response to the inactivation of the first odd delayed signal CDQFD12. Accordingly, when the first odd delayed signal CDQFD12 is reactivated in response to the activation of the second odd output control signal CDQF2, the data fed into the first former-stage latch 311 via the first buffering latch means 331 is output to the odd multiplexing node DOF.

The operation of the even input control signal DLS1 and CDQSD12 is similar to that of the odd input control signal DLF1 and CDQFD12.

The data output to the odd multiplexing node DOF is output in response to the rising edge of the odd output clock signal CLKDQF to serve as the output data DOUT, and the data output to the even multiplexing node DOS is output in response to the rising edge of the even output clock signal CLKDQS to serve as the output data DOUT. In order to do this, preferably, the odd data output unit 300 further includes a switch for outputting the data of the odd multiplexing node DOF to a node for the output data DOUT, and the even data output unit 400 further includes a switch for outputting the data of the even multiplexing node DOS to the node for the output data DOUT.

The odd output clock signal CLKDQF has a slightly faster falling edge than the falling edge of the clock signal CLK and has the same cycle as that of the clock CLK. The even output clock signal CLKDQS has a slightly faster rising edge than the falling edge of the clock signal CLK and has the same cycle as that of the clock CLK. The odd output clock signal CLKDQF and the even output clock signal CLKDQS are generally generated by a DLL (delayed-locked loop) circuit in a semiconductor device and has a slightly faster phase than the clock signal CLK in consideration of a delay occurring on the path from the point in time of generation of the output data DOUT to a data output pad.

Accordingly, the data in the odd multiplexing node DOF is output in response to the rising edge of the clock signal CLK, and the data in the even multiplexing node DOS is output in response to the falling edge of the clock signal CLK.

As shown in FIGS. 3A and 3B, the number of junctions in each of the odd and even multiplexing nodes DOF and DOS, which are output nodes according to the present invention, is reduced from eight junctions in the prior art to four. This leads to a reduction of the load of each of the multiplexing nodes DOF and DOS, such that data can appear on their corresponding multiplexing nodes DOF and DOS earlier than in the prior art. This means a reduction of time taken to output valid data from the latches to each of the multiplexing nodes DOF and DOS. Thus, each of the multiplexing nodes DOF and DOS can provide increased bandwidth, and the total data access time (tAA) can be also improved.

FIG. 5 is a circuit diagram of an embodiment of a circuit (hereinafter, referred to as an input control signal generation unit 500) for generating the odd input control signals DLFj and the even input control signals DLSj. Referring to FIG. 5, the input control signal generation unit 500 includes eight circuit units 510, 520, 530, 540, 550, 560, 570 and 580 for generating the odd and even input control signals DLFj and DLSj, respectively, the eight circuit units having the same structure. The circuit units 510~580 are identical to each other in their structures and operation except that they deal with different input signals and different output signals, so the circuit unit 510 will now be described as a representative circuit.

The circuit unit 510 for generating the first odd input control signal DLF1 includes an auto pulse generator 511 and NOR gates NOR1 and NOR2. Auto pulse generators 511 to 518 each generate a short pulse in response to the rising edge of a received signal.

When the first input control signal DL1 is activated to a high level, the auto pulse generator 511 generates a short pulse. Accordingly, the output of the NOR gate NOR1 enters a low level. Assuming that the initial state of the first odd output control signal CDQF1 is a low level, then, the NOR gate NOR2 has two low level inputs to activate the first odd input control signal DLF1 to a high level. If the first odd output control signal CDQF1 is activated to a high level, the first odd input control signal DLF1 is inactivated to a low level by the NOR gate NOR2, in order to prevent input and output of data to and from latches from occurring at the same time.

In a data outputting method for a data output circuit for semiconductor devices according to an embodiment of the present invention, first, data output from data sense amplifiers are fed into former-stage latches and latter-stage latches in rows. Then, the data stored in the former-stage latches are multiplexed and output. Thereafter, the data stored in the latter-stage latches are fed into the former-stage latches via buffering latch means and are multiplexed and then output.

The present invention reduces the load on the output nodes for synchronous semiconductor devices, thus improving the frequency characteristics. This leads to an improvement in the total operating speed of the entire semiconductor device and the data access time including tAA.

While this invention has been particularly shown and described with reference to preferred embodiments thereof, it will be understood by those skilled in the art that various changes in form and details may be made therein without departing from the spirit and scope of the invention as defined by the appended claims.

What is claimed is:

1. A data output circuit in a synchronous semiconductor device for providing a set of data bits as an output, comprising:
   a first-stage latch unit for receiving a first bit of the data bits in response to a first control signal;
   a second-stage latch unit for receiving a second bit of the data bits in response to the first control signal; and
   a buffering latch unit interposed between the first-stage latch unit and the second-stage latch unit, the buffering latch unit receiving the second bit from the second-stage latch unit and forwarding the second bit to the first-stage latch unit in response to a second control signal.

2. The data output unit of claim 1, wherein the first-stage latch unit receives the first bit of the data bits and the second-stage latch unit receives the second bit of the data bits simultaneously.

3. The data output unit of claim 1, wherein the synchronous semiconductor device is a wave pipelined operating device.

4. The data output unit of claim 1, wherein the first control signal is enabled before the second control signal is enabled, and then the first control signal is disabled in response to the second control signal.

5. The data output unit of claim 1, wherein the first-stage latch unit comprises a plurality of latches for receiving a plurality of the data bits.

6. The data output unit of claim 1, wherein the second-stage latch unit comprises a plurality of latches for receiving a plurality of the data bits.

7. The data output unit of claim 1, wherein the first-stage latch unit is coupled to an output node, the first-stage latch unit forwarding the first bit of the data bits to the output node.

8. The data output unit of claim 7, further comprising a plurality of switches between the first-stage latch unit and the output node for switching the first bit of the data bits to the output node.

9. The data output unit of claim 8, wherein the plurality of switches are controlled by a plurality of second control signals.

10. The data output unit of claim 1, further comprising a first plurality of switches between the buffering latch unit and the first-stage latch unit for enabling data to be forwarded from the buffering latch unit to the first-stage latch unit.

11. The data output unit of claim 10, wherein the plurality of switches are controlled by a plurality of second control signals.

12. The data output unit of claim 10, further comprising a second plurality of switches between second-stage latch unit and the buffering latch unit for enabling data to be forwarded from the second-stage latch unit to the buffering latch unit.

13. The data output unit of claim 12, wherein the second plurality of switches are controlled by a plurality of second control signals.

14. A data output method in a synchronous semiconductor device for providing a set of data bits as an output, comprising:
providing a first-stage latch unit for receiving a first bit of the data bits in response to a first control signal;
providing a second-stage latch unit for receiving a second bit of the data bits in response to the first control signal; and
providing a first buffering latch unit interposed between the first-stage latch unit and the second-stage latch unit, the first buffering latch unit receiving the second bit from the second-stage latch unit and forwarding the second bit to the first-stage latch unit in response to a second control signal.

15. The method of claim 14, wherein the first-stage latch unit receives the first bit of the data bits and the second-stage latch unit receives the second bit of the data bits simultaneously.

16. The method of claim 14, wherein the synchronous semiconductor device is a wave pipelined operating device.

17. The method of claim 14, wherein the first control signal is enabled before the second control signal is enabled, and then the first control signal is disabled in response to the second control signal.

18. The method of claim 14, wherein the first-stage latch unit comprises a plurality of latches for receiving a plurality of the data bits.

19. The method of claim 14, wherein the second-stage latch unit comprises a plurality of latches for receiving a plurality of the data bits.

20. The method of claim 14, wherein the first-stage latch unit is coupled to an output node, the first-stage latch unit forwarding the first bit of the data bits to the output node.

21. The method of claim 20, further comprising providing a plurality of switches between the first-stage latch unit and the output node for switching the first bit of the data bits to the output node.

22. The method of claim 21, wherein the plurality of switches are controlled by a plurality of second control signals.

23. The method of claim 14, further comprising providing a first plurality of switches between the buffering latch unit and the first-stage latch unit for enabling data to be forwarded from the buffering latch unit to the first-stage latch unit.

24. The method of claim 23, wherein the plurality of switches are controlled by a plurality of second control signals.

25. The method of claim 23, further comprising providing a second plurality of switches between second-stage latch unit and the buffering latch unit for enabling data to be forwarded from the second-stage latch unit to the buffering latch unit.

26. The method of claim 25, wherein the second plurality of switches are controlled by a plurality of the second control signals.

27. A data output circuit in a synchronous semiconductor device for providing a set of data bits as an output, comprising:
a first data output unit for receiving a first subset of bits of the set of data bits, the first data output unit comprising:
a first first-stage latch unit for receiving a first bit of the first subset of bits in response to a first control signal;
a first second-stage latch unit for receiving a second bit of the first subset of bits in response to the first control signal; and
a first buffering latch unit interposed between the first first-stage latch unit and the first second-stage latch unit, the first buffering latch unit receiving the second bit of the first subset of bits from the first second-stage latch unit and forwarding the second bit of the first subset of bits to the first first-stage latch unit in response to a second control signal; and
a second data output unit for receiving a second subset of bits of the set of data bits, the second data output unit comprising:
a second first-stage latch unit for receiving a first bit of the second subset of bits in response to a third control signal;
a second second-stage latch unit for receiving a second bit of the second subset of bits in response to the third control signal; and
a second buffering latch unit interposed between the second first-stage latch unit and the second second-stage latch unit, the second buffering latch unit receiving the second bit of the second subset of bits from the second second-stage latch unit and forwarding the second bit of the second subset of bits to the second first-stage latch unit in response to a fourth control signal.

28. The data output unit of claim 27, wherein:
the first first-stage latch unit receives a fist bit of the first subset of bits and the first second-stage latch unit receives a second bit of the first subset of bits simultaneously; and
the second first-stage latch unit receives a first bit of the first subset of bits and the second second-stage latch unit receives a second bit of the first subset of bits simultaneously.

29. The data output unit of claim 27, wherein the synchronous semiconductor device is a wave pipelined operating device.

30. The data output unit of claim 27, wherein:
the first control signal is enabled before the second control signal is enabled, and then the first control signal is disabled in response to the second control signal; and
the third control signal is enabled before the fourth control signal is enabled, and then the third control signal is disabled in response to the fourth control signal.

31. The data output unit of claim 27, wherein the first-stage latch units comprise a plurality of latches for receiving a plurality of the data bits.

32. The data output unit of claim 27, wherein the second-stage latch units comprise a plurality of latches for receiving a plurality of the data bits.

33. The data output unit of claim 27, wherein each of the first-stage latch units coupled to an output node, the first-stage latch units forwarding data bits to the output node.

34. The data output unit of claim 33, further comprising a plurality of switches between the first-stage latch units and the output nodes for switching the data bits to the output nodes.

35. The data output unit of claim 27, further comprising a first plurality of switches between the buffering latch units and the first-stage latch units for enabling data to be forwarded from the buffering latch units to the first-stage latch units.

36. The data output unit of claim 35, further comprising a second plurality of switches between second-stage latch units and the buffering latch units for enabling data to be forwarded from the second-stage latch units to the buffering latch units.

37. The data output unit of claim 27, further comprising a plurality of switches between second-stage latch units and the buffering latch units for enabling data to be forwarded from the second-stage latch units to the buffering latch units.

* * * * *

UNITED STATES PATENT AND TRADEMARK OFFICE
CERTIFICATE OF CORRECTION

PATENT NO.   : 6,631,090 B1                                      Page 1 of 1
DATED        : October 7, 2003
INVENTOR(S)  : Jin-seok Kwak and Seong-Jin Jang It is certified that error appears in the above-identified patent and that said Letters Patent is hereby corrected as shown below:

<u>Column 12,</u>
Line 42, delete "fist" and replace it with -- first --

Signed and Sealed this

Thirteenth Day of January, 2004

JON W. DUDAS
*Acting Director of the United States Patent and Trademark Office*